(12) United States Patent
Wu et al.

(10) Patent No.: US 10,256,173 B2
(45) Date of Patent: Apr. 9, 2019

(54) SEMICONDUCTOR DEVICE AND METHOD FOR MANUFACTURING THE SAME

(71) Applicant: Advanced Semiconductor Engineering, Inc., Kaohsiung (TW)

(72) Inventors: Jun-Chieh Wu, Kaohsiung (TW); Yu-Hsiang Chao, Kaohsiung (TW); Chung-Yao Chang, Kaohsiung (TW); Chun-Cheng Kuo, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/049,352

(22) Filed: Feb. 22, 2016

(65) Prior Publication Data

US 2017/0243813 A1  Aug. 24, 2017

(51) Int. Cl.
*H01L 23/495* (2006.01)
*H01L 23/02* (2006.01)
(Continued)

(52) U.S. Cl.
CPC .... *H01L 23/49811* (2013.01); *H01L 21/4853* (2013.01); *H01L 21/563* (2013.01); *H01L 23/15* (2013.01); *H01L 23/315* (2013.01); *H01L 23/3128* (2013.01); *H01L 23/49827* (2013.01); *H01L 23/5384* (2013.01); *H01L 23/5385* (2013.01); *H01L 24/16* (2013.01); *H01L 25/0657* (2013.01);
(Continued)

(58) Field of Classification Search
CPC .............. H01L 23/49811; H01L 23/315; H01L 23/3128; H01L 2225/1058; H01L 24/16; H01L 21/4853; H01L 25/0657

USPC .............. 257/668, 686, 738, 737, 778, 690, 257/E25.023, E23.069, E25.013; 438/107, 108, 109

See application file for complete search history.

(56) References Cited

U.S. PATENT DOCUMENTS 7,018,866 B2 * 3/2006 Sugaya .................. H01L 21/56
257/687
7,208,824 B2  4/2007 Lee et al.
(Continued)

FOREIGN PATENT DOCUMENTS

TW        I474414        2/2015

OTHER PUBLICATIONS

Complete English translation (equivalent) of Taiwan Patent No. I474414, 51 pages.

*Primary Examiner* — Fernando L Toledo
*Assistant Examiner* — Aaron J Gray
(74) *Attorney, Agent, or Firm* — Foley & Lardner LLP; Cliff Z. Liu

(57) ABSTRACT

The present disclosure relates to a semiconductor device and a method for manufacturing the same. The semiconductor device includes a substrate, a first package body and at least one connecting element. The substrate has a first surface. The first package body is disposed adjacent to the first surface of the substrate, and defines at least one cavity. The connecting element is disposed adjacent to the first surface of the substrate and in a corresponding cavity. A space is defined between a periphery surface of a portion of the connecting element and a sidewall of a portion of the cavity. An end portion of the connecting element extends beyond an outermost surface of the first package body.

17 Claims, 11 Drawing Sheets

(51) Int. Cl.

| | |
|---|---|
| *H01L 23/48* | (2006.01) |
| *H01L 23/52* | (2006.01) |
| *H01L 21/00* | (2006.01) |
| *H01L 23/498* | (2006.01) |
| *H01L 23/00* | (2006.01) |
| *H01L 21/48* | (2006.01) |
| *H01L 21/56* | (2006.01) |
| *H01L 23/31* | (2006.01) |
| *H01L 25/065* | (2006.01) |
| *H01L 23/15* | (2006.01) |
| *H01L 23/538* | (2006.01) |

(52) U.S. Cl.
CPC ............ *H01L 2224/16227* (2013.01); *H01L 2224/48227* (2013.01); *H01L 2225/06572* (2013.01); *H01L 2924/15311* (2013.01); *H01L 2924/15321* (2013.01); *H01L 2924/1815* (2013.01)

(56) References Cited

U.S. PATENT DOCUMENTS

| | | | |
|---|---|---|---|
| 8,222,538 B1* | 7/2012 | Yoshida | H01L 23/3128 174/260 |
| 8,704,368 B1* | 4/2014 | Yoshida | H01L 23/3128 174/260 |
| 2010/0120199 A1 | 5/2010 | Lim et al. | |
| 2010/0171205 A1* | 7/2010 | Chen | H01L 21/565 257/686 |
| 2010/0171207 A1* | 7/2010 | Shen | H01L 21/4853 257/686 |
| 2011/0117700 A1* | 5/2011 | Weng | H01L 21/56 438/109 |
| 2012/0126396 A1 | 5/2012 | Zhao et al. | |
| 2012/0193783 A1* | 8/2012 | Hong | H01L 23/3128 257/737 |
| 2015/0091118 A1* | 4/2015 | Sato | H01L 23/13 257/432 |
| 2015/0287672 A1* | 10/2015 | Yazdani | H01L 21/486 257/414 |

* cited by examiner

SEMICONDUCTOR DEVICE AND METHOD FOR MANUFACTURING THE SAME

BACKGROUND

1. Technical Field

The present disclosure relates to a semiconductor device and a method for manufacturing the same. In particular, the present disclosure relates to a semiconductor device including at least one connecting element that extends beyond a package body thereof and a method for manufacturing the same.

2. Description of the Related Art

In general, a semiconductor package may include a substrate with a semiconductor die disposed over the substrate, an interposer, interconnects to form electrical connections between the substrate and the interposer, and a molding compound formed between the substrate and the interposer to encapsulate the semiconductor die and the interconnects. However, a thickness of such semiconductor package is greater (e.g., greater than 1.0 millimeter (mm)) than is specified for some semiconductor packages (e.g., less than 0.5 mm). Further, bonding the semiconductor package to a motherboard (e.g., a printed circuit board) through pads on a surface of the interposer can be difficult, thus, the quality and yield may be low.

SUMMARY

An aspect of the present disclosure relates to a semiconductor device. In an embodiment, the semiconductor device includes a substrate, a package body and a connecting element. The package body is disposed adjacent to a surface of the substrate, and defines a cavity. The connecting element is disposed adjacent to the surface of the substrate and in the cavity. A space is defined between a periphery surface of a portion of the connecting element and a sidewall of a portion of the cavity. An end portion of the connecting element extends beyond an outermost surface of the package body.

In an embodiment, a semiconductor device includes a substrate having a first surface and a second surface opposite to the first surface. The substrate includes at least one ball pad. The semiconductor device further includes a package body disposed adjacent to the first surface of the substrate, the package body defining a cavity, and the cavity including a first portion and a second portion. The semiconductor device further includes a device spaced apart from the substrate, and at least one connecting element connecting the substrate and the device. Each connecting element includes a first portion and a second portion, the first portion of the connecting element fills the first portion of the cavity and contacts a respective ball pad, the second portion of the connecting element is in the second portion of the cavity, a space is defined between a periphery surface of the second portion of the connecting element and a sidewall of the second portion of the cavity, and the second portion of the connecting element connects to the device. The semiconductor device further includes a sensor plate attached and electrically connected to the second surface of the substrate.

A method for manufacturing a semiconductor device includes (a) providing a substrate and a semiconductor die, where the semiconductor die is electrically connected to a surface of the substrate; (b) forming a first solder ball adjacent to the surface of the substrate; (c) forming a package body to encapsulate the semiconductor die and the first solder ball; (d) removing a portion of the package body to form an opening to expose a portion of the first solder ball; and (e) fusing a second solder ball with the first solder ball to form a connecting element, wherein a space is defined between a periphery surface of a portion of the connecting element and a sidewall of the opening, and an end portion of the connecting element extends beyond the package body.

DETAILED DESCRIPTION

The present disclosure describes a semiconductor device that allows for a decreased thickness of the semiconductor device, such as by omitting an interposer, and improved quality of bonding between the semiconductor device and a motherboard.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

Figure 1:
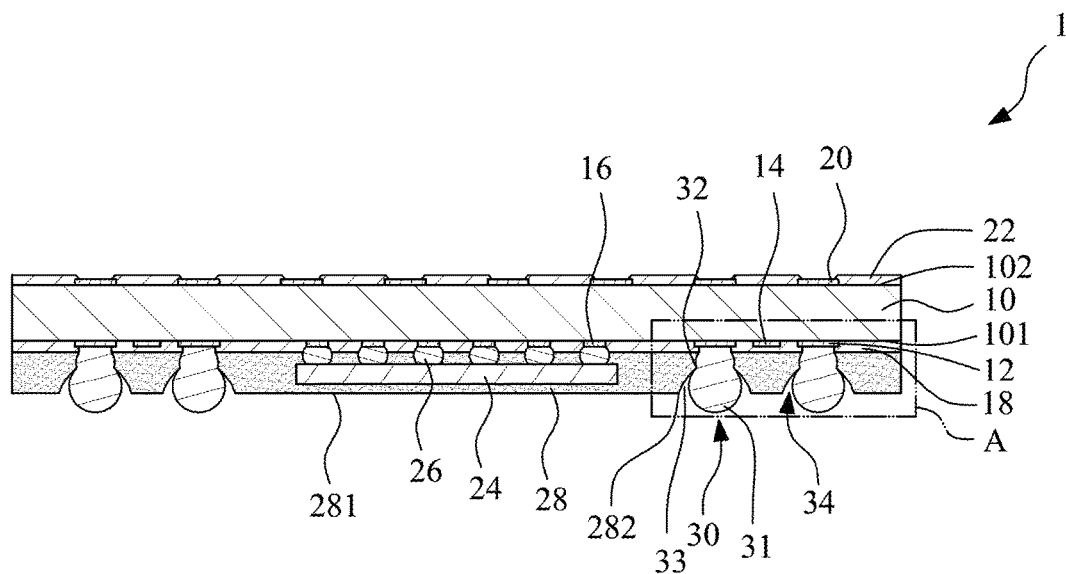
FIG. 1 is a cross-sectional view of a semiconductor device according to an embodiment of the present disclosure.

FIG. 1 is a cross-sectional view of a semiconductor device 1 according to an embodiment of the present disclosure. In one or more embodiments, the semiconductor device 1 is a semiconductor package that is bonded to a motherboard (not shown in FIG. 1). The semiconductor device 1 includes a substrate 10, ball pads 12, traces 14, bump pads 16, a first solder mask 18, top pads 20, a second solder mask 22, a semiconductor die 24, conductive bumps 26, a package body 28 and at least one connecting element 30.

The substrate 10 is a package substrate, and has a first surface 101 and a second surface 102 opposite to the first surface 101. The ball pads 12, the traces 14 and the bump pads 16 are included in a first circuit pattern disposed on the first surface 101 of the substrate 10. The traces 14 may be disposed between ball pads 12. For example, as illustrated in the area surrounded by dotted line in FIG. 1 (labeled 'A'), one trace 14 is routed between two adjacent ball pads 12. In other embodiments, two or more traces 14, or no traces 14, may be routed between two adjacent ball pads 12. The first solder mask 18 covers the first surface 101 of the substrate 10, and the ball pads 12 and the bump pads 16 are exposed from the first solder mask 18. The top pads 20 are included in a second circuit pattern disposed on the second surface 102 of the substrate 10. The second solder mask 22 covers the second surface 102 of the substrate 10, and the top pads 20 are exposed from the second solder mask 22. In one or more embodiments, solder balls or solder bumps are disposed over respective ones of the top pads 20.

The semiconductor die 24 is disposed adjacent to the first surface 101 of the substrate 10, and is electrically connected to the first circuit pattern (e.g., the circuit pattern that includes the ball pads 12, the traces 14 and the bump pads 16) on the first surface 101 of the substrate 10. In this embodiment, the semiconductor die 24 is electrically connected to the first circuit pattern by flip chip bonding, that is, the semiconductor die 24 is connected to the bump pads 16 through the conductive bumps 26. However, in another embodiment, the semiconductor die 24 may be electrically connected to the first circuit pattern by wire bonding.

The package body 28 is disposed adjacent to the first surface 101 of the substrate 10, is disposed over the first solder mask 18, and encapsulates the semiconductor die 24. The material of the package body 28 is, for example, an encapsulant or a molding compound. The package body 28 defines one or more cavities 34 around a periphery of the semiconductor die 24.

The connecting element 30 is disposed adjacent to the first surface 101 of the substrate 10, and is disposed in a corresponding cavity 34. In the embodiment of FIG. 1, the semiconductor device 1 includes a plurality of connecting elements 30 that are disposed over respective ones of the ball pads 12 positioned around the semiconductor die 24. In the embodiment of FIG. 1, the connecting element 30 is a combined solder ball that is formed by fusing two stacked solder balls, and the connecting element 30 thus includes a neck portion 32. A portion of the connecting element 30 is within the package body 28, and another portion of the connecting element 30 protrudes from the package body 28, beyond the cavity 34. In other words, the connecting element 30 is disposed adjacent to the first surface 101 of the substrate 10, and is partially encapsulated by the package body 28.

A space 33 is defined between a periphery surface of a portion of the connecting element 30 and a sidewall of a portion of the cavity 34. That is, a maximum lateral width of the cavity 34 is greater than a maximum lateral width of the connecting element 30, thus, there is empty space (space 33) between the periphery surface of the portion of the connecting element 30 and the sidewall of the portion of the cavity 34, and the connecting element 30 does not fully fill the cavity 34. In addition, an end portion 31 of the connecting element 30 extends beyond/protrudes from a bottom surface 281 of the package body 28, where the bottom surface 281 of the package body 28 is an outermost surface of the package body 28 on the side of semiconductor device 1 including the package body 28, and is substantially parallel with the first surface 101 of the substrate 10. In one or more embodiments, the cavity 34 may be formed by a laser process according to a predetermined pattern. Because there is an empty space 33 between the periphery surface of the portion of the connecting element 30 and the sidewall of the portion of the cavity 34, when the connecting element 30 is bonded to an electrical element (e.g., a motherboard or a semiconductor package), the space 33 can accommodate the extruded molten connecting element 30. Thus, bridging between two adjacent connecting elements 30 can be avoided. In addition, the space 33 can relieve a stress concentration effect, as explained below. If the space 33 between the periphery surface of the portion of the connecting element 30 and the sidewall of the portion of the cavity 34 were to be omitted (that is, the connecting element 30 were to fully fill the cavity 34), a bottom corner 282 or bottom edge of the package body 28 would resultantly contact the connecting element 30 and would form a stress concentration region, such that, after the connecting element 30 is bonded to an electrical element (e.g., on a motherboard or a semiconductor package), a crack may occur in the connecting element 30 starting from the bottom corner 282 or bottom edge of the package body 28. Accordingly, the space 33 provided as shown in FIG. 1 can separate the bottom corner 282 or bottom edge of the package body 28 from the periphery surface of the connecting element 30 (that is, the bottom corner 282 or bottom edge of the package body 28 will not contact the periphery surface of the connecting element 30); thus, the described stress concentration effect and resulting crack can be avoided, which increases the reliability of bonding.

Figure 2:
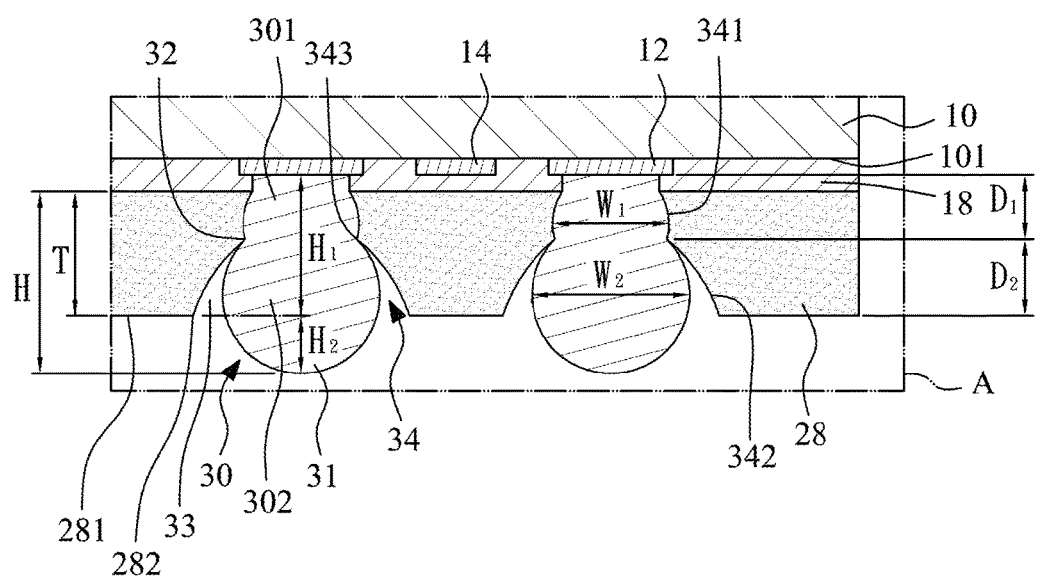
FIG. 2 is a partially enlarged view of area 'A' of the semiconductor device illustrated in FIG. 1.
Figure 6:
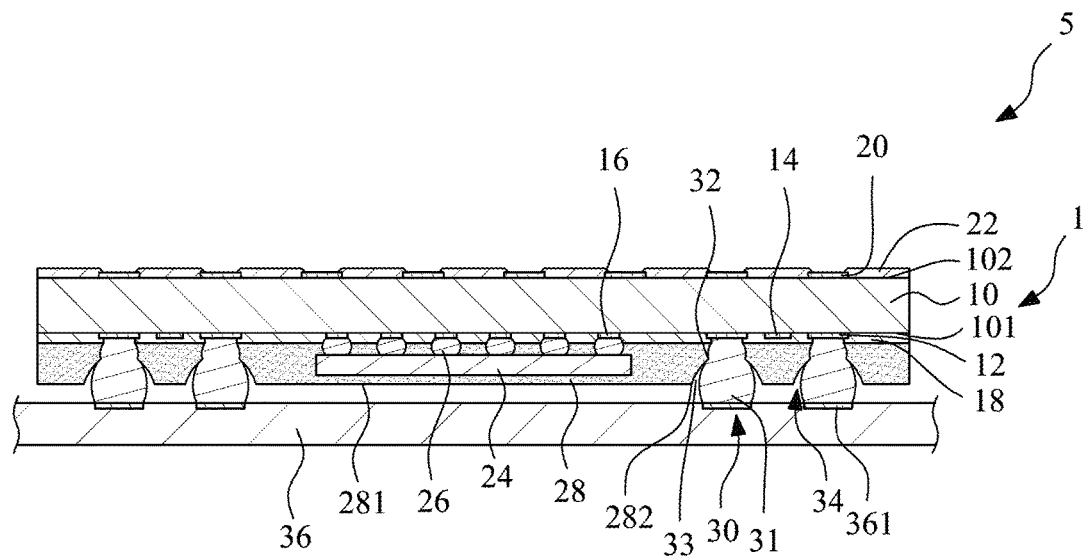
FIG. 6 is a cross-sectional view of a semiconductor device according to an embodiment of the present disclosure.
Figure 15:
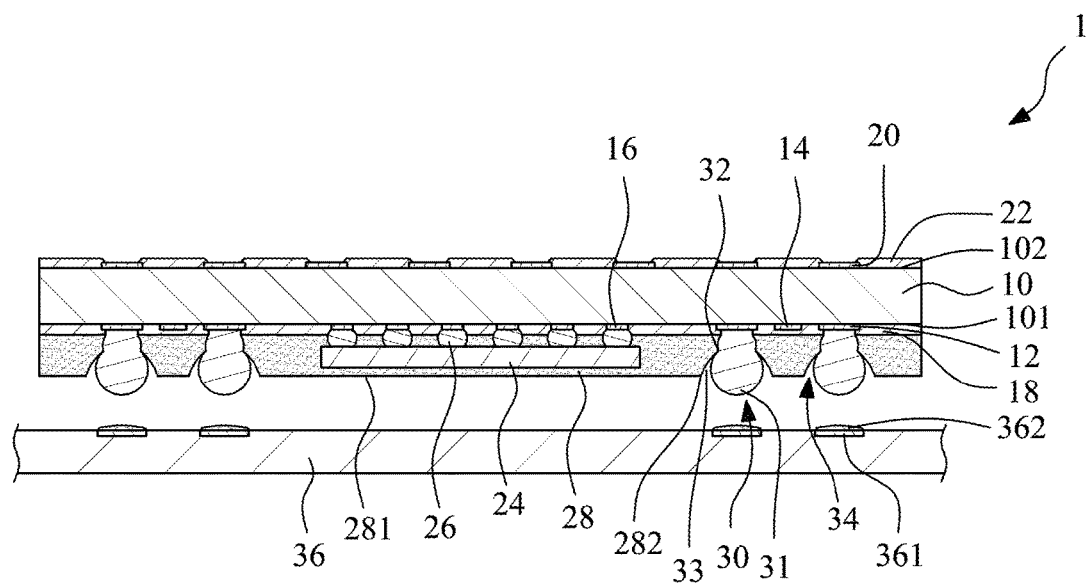
FIG. 15 illustrates a method for manufacturing a semiconductor device according to an embodiment of the present disclosure.

FIG. 2 is an enlarged view of area 'A' of the semiconductor device 1 illustrated in FIG. 1. A height H of the connecting element 30 and a thickness T of the package body 28 are measured from a top surface of the package body 28 (a bottom surface of the first solder mask 18) along a vertical direction of the substrate 10 in the orientation shown, wherein H is greater than T, such that the end portion 31 of the connecting element 30 extends beyond or protrudes from the bottom surface 281 of the package body 28. Thus, the connecting element 30 can be bonded directly to an electrical contact of another device (e.g., as shown in FIG. 6 bonded to an electrical contact 361 of an electrical element 36 such as on a motherboard or a semiconductor package, where the electrical contact 361 may, but does not necessarily, have a pre-solder 362 thereon as shown in FIG. 15, and the connecting element 30 is bonded to the pre-solder 362.)

In one or more embodiments, the first solder mask 18 is omitted, and the package body 28 is disposed over the first surface 101 of the substrate 10; thus, the height H of the connecting element 30 and the thickness T of the package body 28 are measured from the first surface 101 of the substrate 10.

As shown in FIGS. 1 and 2, the end portion 31 of the connecting element 30 is a free end (not bonded or connected to another device or component) in the completed semiconductor device 1. Thus, the periphery surface of the end portion 31 of the connecting element 30 is a curved surface due to cohesion forces.

The connecting element 30 includes a first portion 301 above the neck portion 32 of the connecting element 30 and a second portion 302 below the neck portion 32. The cavity 34 includes a first portion 341 having a sidewall adjacent to the first portion 301 of the connecting element 30, and a second portion 342 having a sidewall adjacent to the second portion 302 of the connecting element 30, with the space 33 between the second portion 302 of the interconnecting element 30 and the sidewall of the second portion 342 of the cavity 34. The first portion 301 of the connecting element 30 fills the first portion 341 of the cavity 34 and contacts the ball pad 12 on the substrate 10. The second portion 302 of the connecting element 30 is in the second portion 342 of the cavity 34. The space 33 is between a periphery surface of the second portion 302 of the connecting element 30 and the sidewall of the second portion 342 of the cavity 34. The end portion 31 of the second portion 302 of the connecting element 30 extends beyond the bottom surface 281 (the outermost surface) of the package body 28.

A curvature of a sidewall of the first portion 341 of the cavity 34 and a curvature of a sidewall of the second portion 342 of the cavity 34 are discontinuous; that is, there is a turning point 343 at an apex or peak in the package body 28 between the first portion 341 and the second portion 342 of the cavity 34, corresponding to and co-located with a valley in the neck portion 32 of the connecting element 30. Correspondingly, a curvature of a periphery surface of the first portion 301 of the connecting element 30 is discontinuous with a curvature of a periphery surface of the second portion 302 of the connecting element 30.

A maximum lateral width of the second portion 342 of the cavity 34 is greater than a maximum lateral width $W_1$ of the first portion 341 of the cavity 34. A maximum lateral width $W_2$ of the second portion 302 of the connecting element 30 is greater than a maximum lateral width $W_1$ of the first portion 301 of the connecting element 30, and $W_2=a*W_1$, where 'a' is a multiplier of about 0.8 to about 1.6, such as greater than 1, or about 1.05 to about 1.24. If the value of 'a' is too low (e.g., less than about 0.8), a height $H_2$ of the exposed portion of the connecting element 30 that extends beyond the bottom surface 281 (the outermost surface) of the package body 28 will be too small, and when the connecting element 30 is bonded (e.g., to a motherboard or a semiconductor package), non-wetting may occur and a resulting bonding strength may be poor.

If the value of 'a' is too high (e.g., greater than about 1.6), the height $H_2$ of the exposed portion of the connecting element 30 will be too great, and when the connecting element 30 is bonded (e.g., to a motherboard or a semiconductor package), solder bridging between two connecting elements 30 may occur.

A height of a portion of the connecting element 30 below the bottom surface 281 is $H_1$, where $H_1=b*H_2$, where 'b' is a multiplier of about 1.6 to about 5.8, such as greater that about 1, greater that about 2, or about 2.2 to about 4.71. If the value of $H_1$ is constant and the value of 'b' is too high (e.g., greater than about 5.8), the height $H_2$ of the exposed portion of the connecting element 30 that extends beyond the bottom surface 281 (the outermost surface) of the package body 28 will be too small, and when the connecting element 30 is bonded to an electrical element (e.g., to a motherboard or a semiconductor package), non-wetting may occur and a resulting bonding strength may be poor. If the value of $H_1$ is constant and the value of 'b' is too low (e.g., less than 1.6), the height $H_2$ of the exposed portion of the connecting element 30 will be too great, and when the connecting element 30 is bonded (e.g., to a motherboard or a semiconductor package), solder bridging between two connecting elements 30 may occur.

As shown in FIG. 2, a depth of the first portion 341 of the cavity 34 is defined as $D_1$, and a depth of the second portion 342 of the cavity 34 is defined as $D_2$, where $D_2=c*D_1$, where 'c' is a multiplier of about 0.9 to about 20, such as greater than about 1, greater than about 2, or about 2.21 to about 2.52. If the value of 'c' is too low (e.g., less than about 0.9), a volume of the second portion 342 will be too small, which results in the height $H_2$ of the exposed portion of the connecting element 30 that extends beyond the bottom surface 281 (the outermost surface) of the package body 28 being too great, and when the connecting element 30 is bonded (e.g., to a motherboard or a semiconductor package), solder bridging between two connecting elements 30 may occur. If the value of 'c' is too high (e.g., greater than about 20, the height $H_2$ of the exposed portion of the connecting element 30 will be too small, and when the connecting element 30 is bonded (e.g., to a motherboard or a semiconductor package), non-wetting may occur and a resulting bonding strength may be poor.

Figure 3:
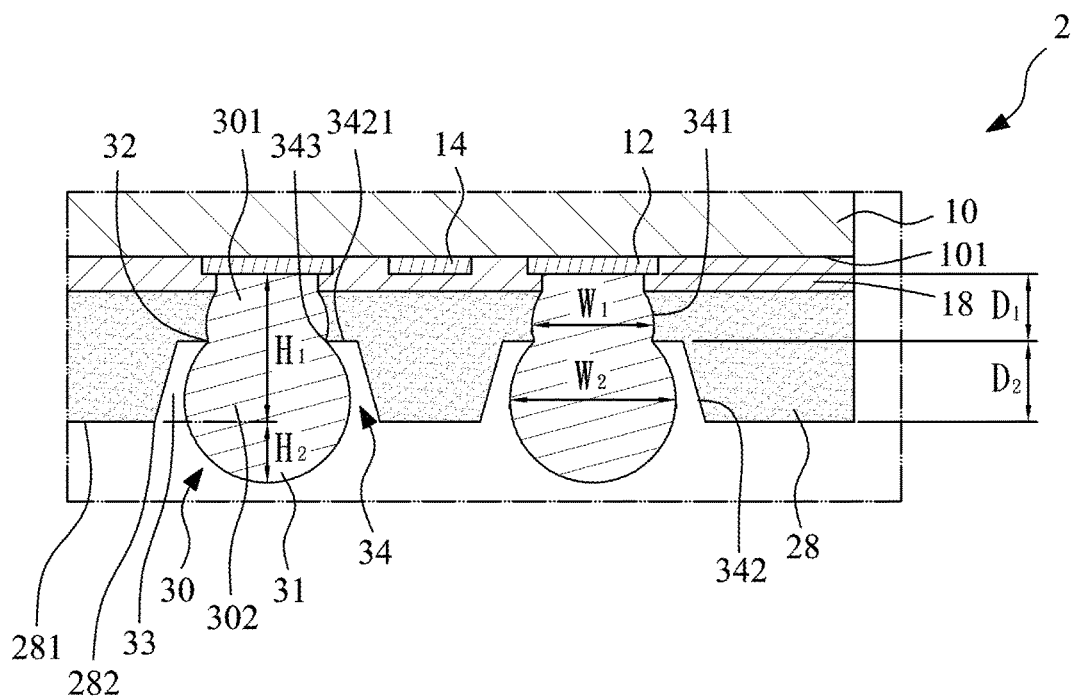
FIG. 3 is a cross-sectional view of a semiconductor device according to an embodiment of the present disclosure.

FIG. 3 is a cross-sectional view of a semiconductor device 2 according to an embodiment of the present disclosure. The semiconductor device 2 of FIG. 3 is similar to the semiconductor device 1 illustrated in FIG. 1 and FIG. 2, except that a top surface 3421 of the second portion 342 of the cavity 34 is a substantially flat surface. The second portion 302 of the connecting element 30 protrudes from the top surface 3421 of the second portion 342. That is, the neck portion 32 of the connecting element 30 is at a junction of the first portion 341 of the cavity 34 and the top surface 3421 of the second portion 342 of the cavity 34.

Figure 4:
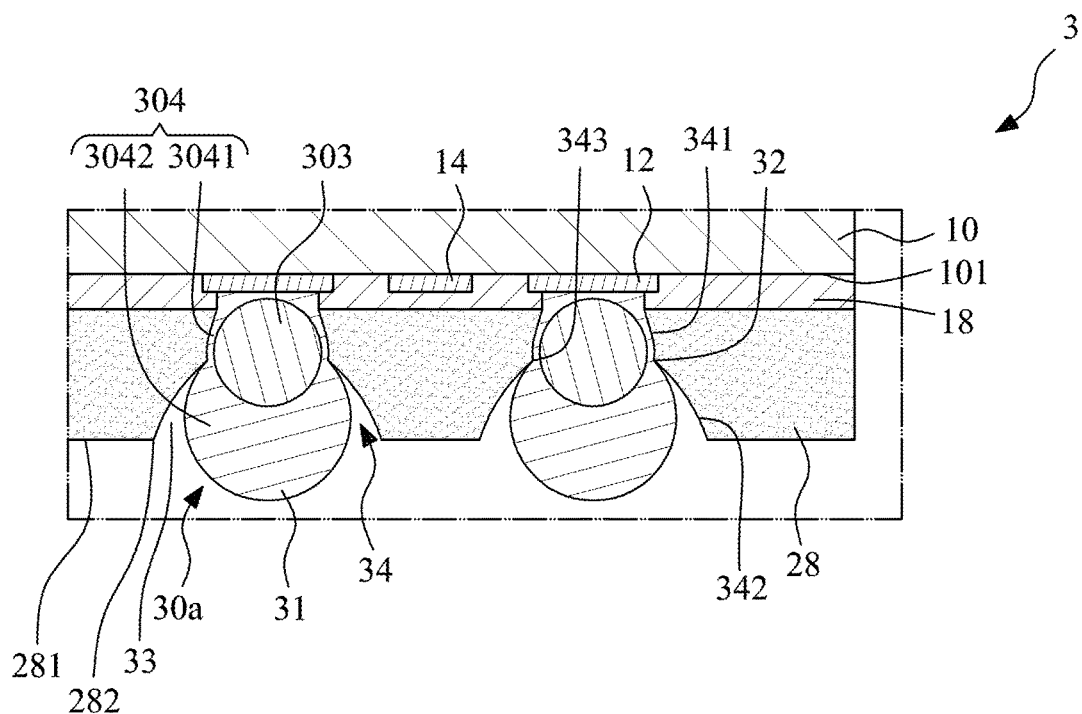
FIG. 4 is a cross-sectional view of a semiconductor device according to an embodiment of the present disclosure.

FIG. 4 is a cross-sectional view of a semiconductor device 3 according to an embodiment of the present disclosure. The semiconductor device 3 of FIG. 4 is similar to the semiconductor device 1 illustrated in FIG. 1 and FIG. 2, except that a connecting element 30a includes a core portion 303 and a periphery portion 304 covering the core portion 303. The material of the core portion 303 is different from that of the periphery portion 304. In one or more embodiments, the core portion 303 includes copper, gold or an alloy thereof, and the periphery portion 304 includes a solder of tin (Sn), or a solder based on lead/tin (PbSn) or tin/silver (SnAg). In one or more embodiments, a material of the core portion 303 has a higher melting temperature than that of the periphery portion 304. In FIG. 4, the periphery portion 304 includes a first portion 3041 above the neck portion 32 and a second portion 3042 below the neck portion 32, where a maximum thickness (in the vertical direction in the orientation shown) of the second portion 3042 is greater than a maximum thickness of the first portion 3041. The maximum thickness of the second portion 3042 may be as much as, or greater than, about five to ten times the maximum thickness of the first portion 3041.

Figure 5:
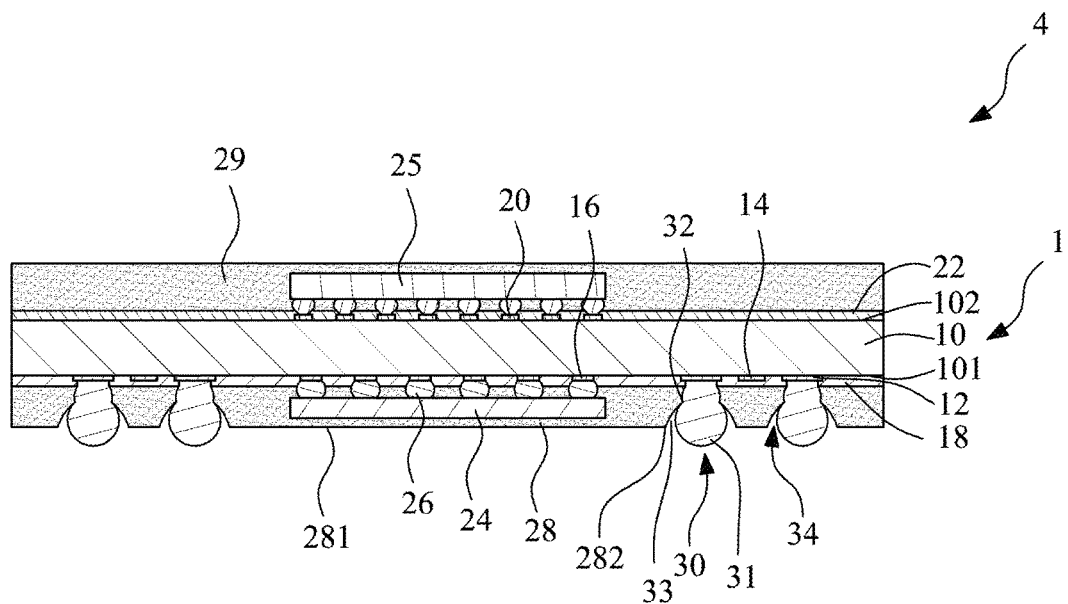
FIG. 5 is a cross-sectional view of a semiconductor device according to an embodiment of the present disclosure.

FIG. 5 is a cross-sectional view of a semiconductor device 4 according to an embodiment of the present disclosure. The semiconductor device 4 of FIG. 5 is similar to the semiconductor device 1 illustrated in FIG. 1 and FIG. 2, except that the semiconductor device 4 further includes a second semiconductor die 25 and a second package body 29. The semiconductor die 25 is electrically connected to the top pads 20 on the second surface 102 of the substrate 10, and the package body 29 is disposed over the second surface 102 of the substrate 10 to encapsulate the semiconductor die 25.

FIG. 6 is a cross-sectional view of a semiconductor device 5 according to an embodiment of the present disclosure. The semiconductor device 5 of FIG. 6 is similar to the semiconductor device 1 illustrated in FIG. 1 and FIG. 2, except that the semiconductor device 5 further includes a device 36 that may be a motherboard or a semiconductor package. The device 36 is spaced apart from the substrate 10, and includes at least one electrical contact 361 (e.g., a bonding pad) adjacent to a surface thereof. As shown in FIG. 6, the connecting element 30 of the semiconductor device 1 is bonded to the device 36, and the end portion 31 of the connecting element 30 contacts the electrical contact 361.

Figure 7:
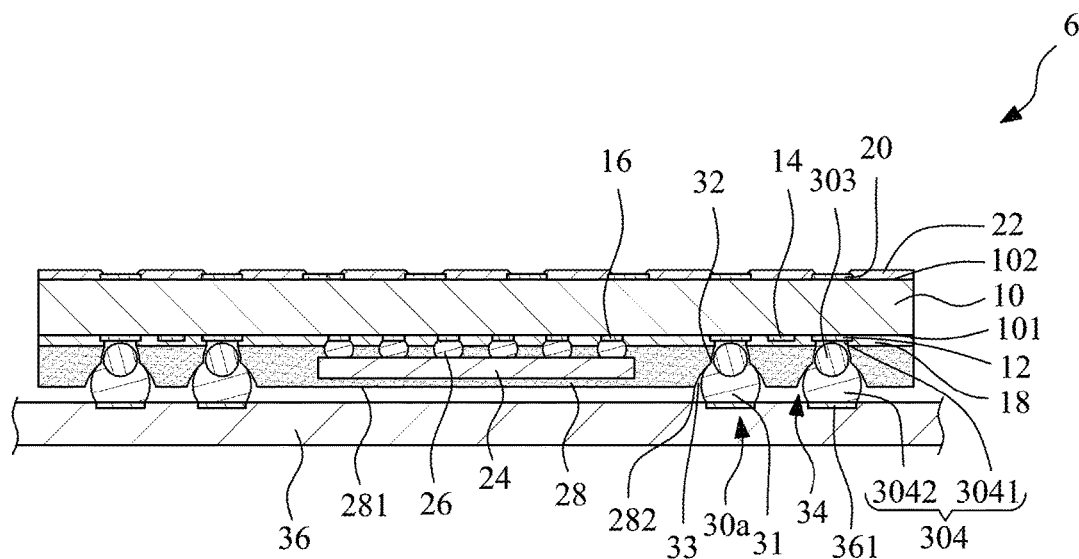
FIG. 7 is a cross-sectional view of a semiconductor device according to an embodiment of the present disclosure.

FIG. 7 is a cross-sectional view of a semiconductor device 6 according to an embodiment of the present disclosure. The semiconductor device 6 of FIG. 7 is similar to the semiconductor device 5 illustrated in FIG. 6, except that the connecting element 30a includes a core portion 303 and a periphery portion 304 covering the core portion 303 as shown in, and described with respect to, FIG. 4. The core portion 303 includes copper, gold or an alloy thereof, and the periphery portion 304 includes Sn solder, PbSn-based solder or SnAg-based solder.

Figure 8:
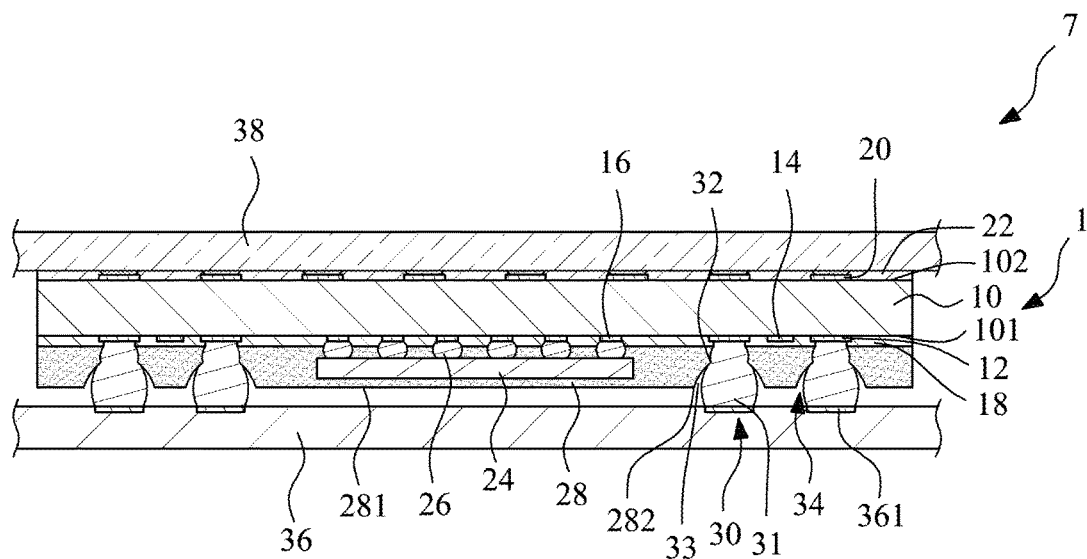
FIG. 8 is a cross-sectional view of a semiconductor device according to an embodiment of the present disclosure.

FIG. 8 is a cross-sectional view of a semiconductor device 7 according to an embodiment of the present disclosure. The semiconductor device 7 of FIG. 8 is similar to the semiconductor device 5 illustrated in FIG. 6, except that the semiconductor device 7 further includes a glass plate 38 attached to, and electrically connected to, the top pads 20 on the second surface 102 of the substrate 10. The glass plate 38 includes an electrical circuit therein, so that when a finger of a user touches the glass plate 38, an electrical potential difference caused by a whorl of the finger can be provided to the semiconductor die 24 for processing. The semiconductor device 7 thus can be implemented in a fingerprint sensor. More generally, a variety of sensor plates, such as a variety of fingerprint sensor plates, can be connected to the substrate 10 as illustrated and described for the glass plate 38.

Figure 9:
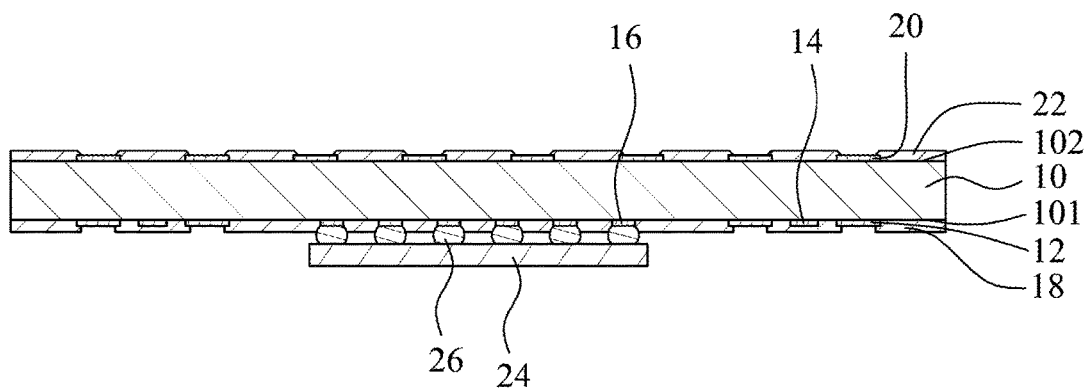
FIG. 9, FIG. 10, FIG. 11, FIG. 12, FIG. 13 and FIG. 14 illustrate a method for manufacturing a semiconductor device according to an embodiment of the present disclosure.

FIGS. 9 to 14 illustrate a method for manufacturing a semiconductor device according to an embodiment of the present disclosure. Referring to FIG. 9, a substrate 10 and a semiconductor die 24 are provided. The substrate 10 has a first surface 101 and a second surface 102 opposite to the first surface 101. Ball pads 12, traces 14 and bump pads 16 are included in a first circuit pattern disposed on the first surface 101 of the substrate 10. The traces 14 may be disposed between ball pads 12. A first solder mask 18 covers the first surface 101 of the substrate 10, and the ball pads 12 and the bump pads 16 are exposed from the first solder mask 18. Top pads 20 are included in a second circuit pattern disposed on the second surface 102 of the substrate 10. A second solder mask 22 covers the second surface 102 of the substrate 10, and the top pads 20 are exposed from the second solder mask 22.

The semiconductor die 24 is disposed adjacent to the first surface 101 of the substrate 10, and is electrically connected to the first circuit pattern (e.g., the circuit pattern including the ball pads 12, the traces 14 and the bump pads 16) on the first surface 101 of the substrate 10. In this embodiment, the semiconductor die 24 is electrically connected to the first circuit pattern by flip chip bonding, that is, the semiconductor die 24 is connected to the bump pads 16 through the conductive bumps 26. However, in other embodiments, the semiconductor die 24 may be electrically connected to the first circuit pattern by wire bonding.

Figure 10:
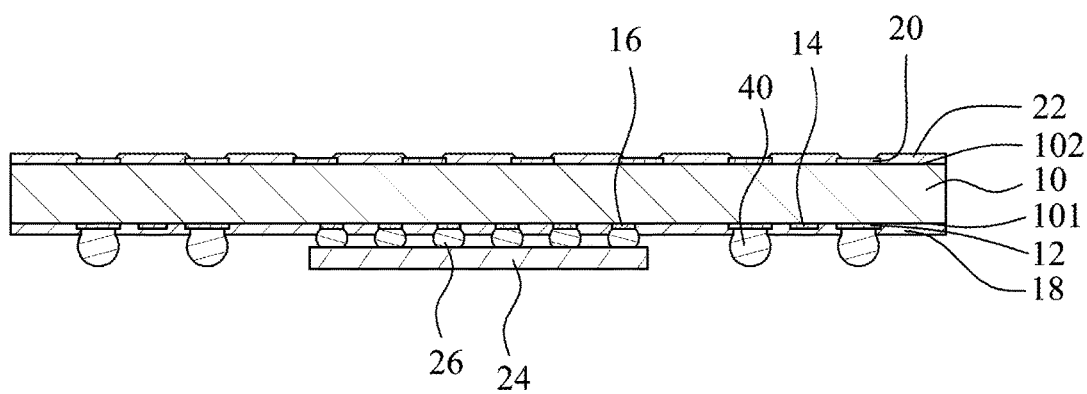

Referring to FIG. 10, one or more first solder balls 40 are formed adjacent to the first surface 101 of the substrate 10. In this embodiment, a plurality of solder balls 40 are disposed over respective ones of the ball pads 12 positioned around the semiconductor die 24. The solder ball 40 includes Sn solder, PbSn-based solder or SnAg-based solder.

Figure 11:
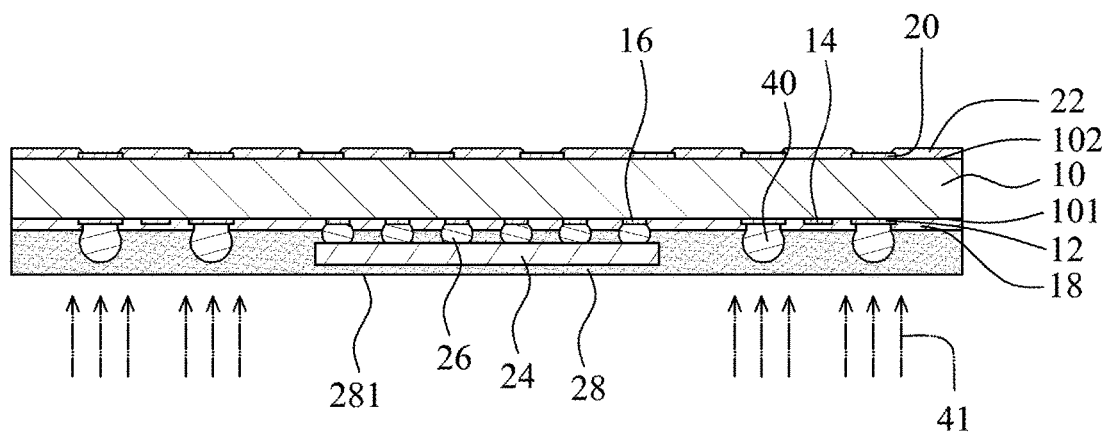

Referring to FIG. 11, a package body 28 is formed adjacent to the first surface 101 of the substrate 10 to encapsulate/cover the semiconductor die 24 and the solder balls 40. The package body 28 is, for example, an encapsulant or a molding compound, and the package body 28 is disposed over the first solder mask 18. The package body 28 has a bottom surface 281. A portion of the package body 28 corresponding to locations below the solder balls 40 is removed along one or more machining paths 41 so as to expose the solder balls 40. In one or more embodiments, the machining paths 41 are paths followed by one or more laser beams and the laser beams are applied on areas below the solder balls 40 (in the orientation shown in FIG. 11).

Figure 12:
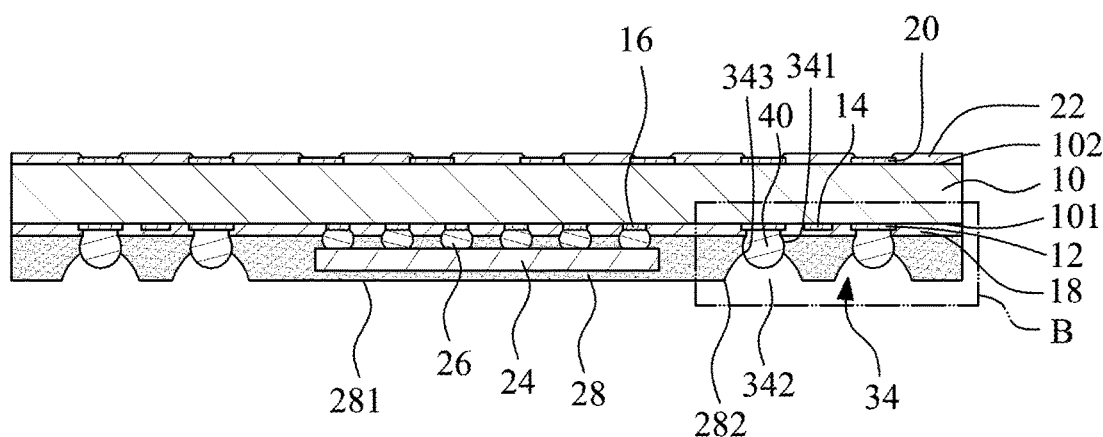

Referring to FIG. 12, a portion of the package body 28 is removed from the bottom surface 281 to form one or more openings, each opening exposing a lower portion of a corresponding solder ball 40. That is, the lower portion of the solder ball 40 does not extend beyond the bottom surface 281 of the package body 28. Each opening formed below a corresponding solder ball 40 defines a second portion 342 of a cavity 34, where the cavity 34 further includes a first portion 341 and a turning point 343. A curvature of a sidewall of the first portion 341 of the cavity 34 and a curvature of a sidewall of the second portion 342 of the cavity 34 are discontinuous, thus the turning point 343 is the intersecting point of the first portion 341 and the second portion 342. The first portion 341 is above the turning point 343, and the second portion 342 is below the turning point 343.

Figure 13:
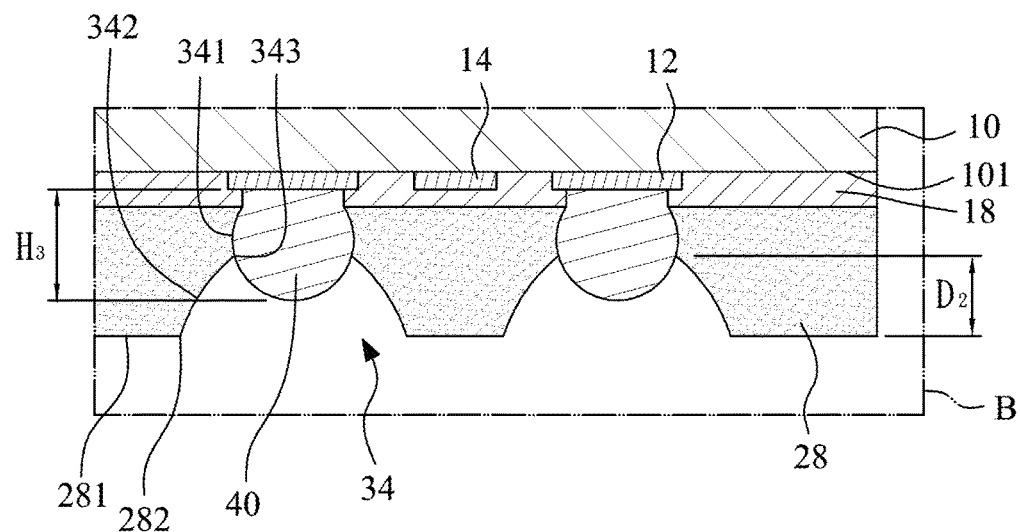

FIG. 13 is an enlarged view of area 'B' in FIG. 12. The upper portion of the solder ball 40 fills the first portion 341 of the cavity 34 and contacts the ball pad 12 on the substrate 10, and the lower portion of the solder ball 40 is in the second portion 342 of the cavity 34. A depth $D_2$ of the second portion 342 is about one half of a total height $H_3$ of the solder ball 40.

Figure 14:
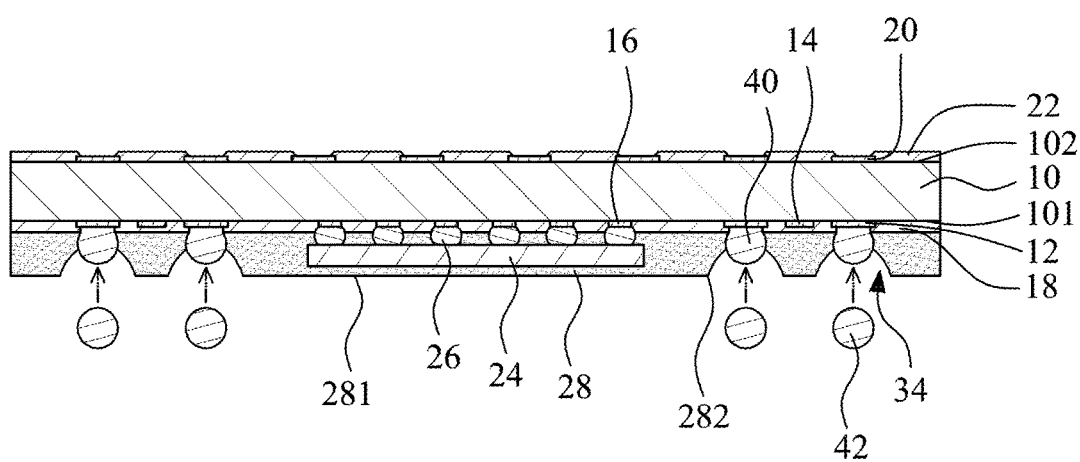

Referring to FIG. 14, one or more second solder balls 42 are provided to be fused with a corresponding solder ball 40 to form at least one connecting element 30 so as to form the semiconductor device 1 illustrated in FIG. 1 and FIG. 2. In this embodiment, a volume of the solder ball 42 is substantially equal to a volume of the solder ball 40, and a material of the solder ball 42 is the same as, or similar to, a material of the solder ball 40. As shown in FIG. 1 and FIG. 2, a space 33 is defined between a periphery surface of the second portion 302 of the connecting element 30 and a sidewall of the second portion 342 of the cavity 34. The end portion 31 of the second portion 302 of the connecting element 30 extends beyond the bottom surface 281 (the outermost surface) of the package body 28.

As described with respect to FIG. 13, the depth $D_2$ of the second portion 342 of the cavity 34 is about one half of a height $H_3$ of the first solder ball 40. After fusing the solder ball 42 to the solder ball 40 to form the connecting element 30, a ratio of a volume of the connecting element 30 (a sum of the volumes of solder balls 40 and 42) to a volume capacity of second portion 342 of the cavity 34 is about 1:1.2 (that is, the volume capacity of the second portion 342 of the cavity 34 is about 1.2 times the volume of the connecting element 30), which is a desired condition. Therefore, when the connecting element 30 is bonded to a device (e.g., a motherboard or a semiconductor package), the space 33 (FIG. 2) is large enough to accommodate the extruded molten connecting element 30. Thus, bridging between two adjacent connecting elements 30 can be avoided, and the quality of bonding is improved. Further, a ratio of about 1:1.2 provides sufficient protrusion of the connecting element 30 beyond the surface 281 for connecting to a device (e.g., a motherboard or a semiconductor package). More generally, the volume capacity of the second portion 342 of the cavity 34 is greater than the volume of the connecting element 30 by a factor about 1.05 or more, about 1.1 or more, about 1.15 or more, or about 1.2, or less than about 1.4.

FIG. 15 illustrates a method for manufacturing a semiconductor device according to an embodiment of the present disclosure. In one or more embodiments, the semiconductor device 1 illustrated in FIG. 1 and FIG. 2 is bonded to a device 36 (e.g., a motherboard or a semiconductor package). As shown in FIG. 15, the end portion 31 of the connecting element 30 is bonded to a pre-solder 362 on an electrical contact 361 (e.g., a bonding pad) of the device 36, so as to obtain the semiconductor device 5 illustrated in FIG. 6. However, in other embodiments, the end portion 31 of the connecting element 30 is bonded to the electrical contact 361 of the device 36 without the use of the pre-solder 362.

In one or more embodiments, a glass plate 38 is further attached to the second surface 102 of the substrate 10, so as to obtain the semiconductor device 7 illustrated in FIG. 8.

Figure 16:
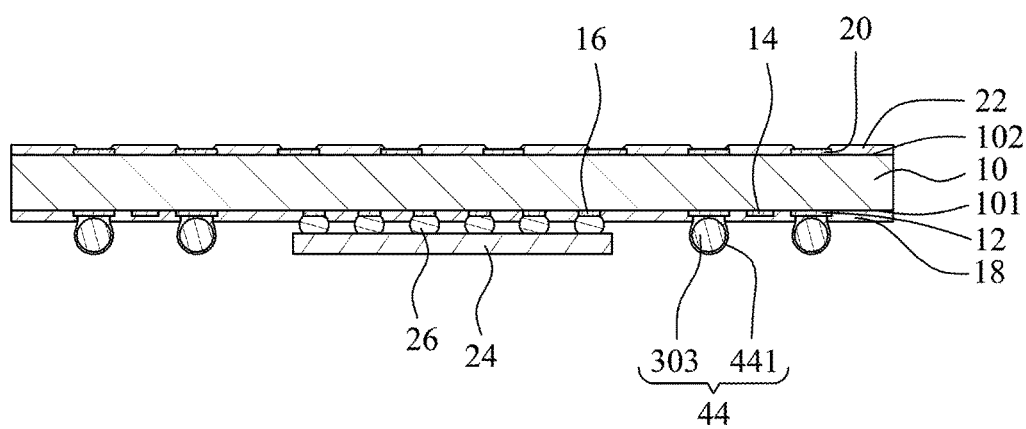
FIG. 16, FIG. 17, FIG. 18 and FIG. 19 illustrate a method for manufacturing a semiconductor device according to an embodiment of the present disclosure.

FIGS. 16 to 19 illustrate a method for manufacturing a semiconductor device according to an embodiment of the present disclosure. The initial stage of this embodiment is similar to that shown in, and described with respect to, FIG. 9, and the stage of FIG. 16 is subsequent to the stage of FIG. 9. FIG. 16 is similar to FIG. 10, except that the solder ball 44 is a solid core solder ball that includes a core portion 303 and a periphery portion 441 covering the core portion 303. The core portion 303 includes copper, gold or an alloy thereof, and the periphery portion 304 includes Sn solder, PbSn-based solder or SnAg-based solder. A thickness of the periphery portion 441 is substantially uniform.

Figure 17:
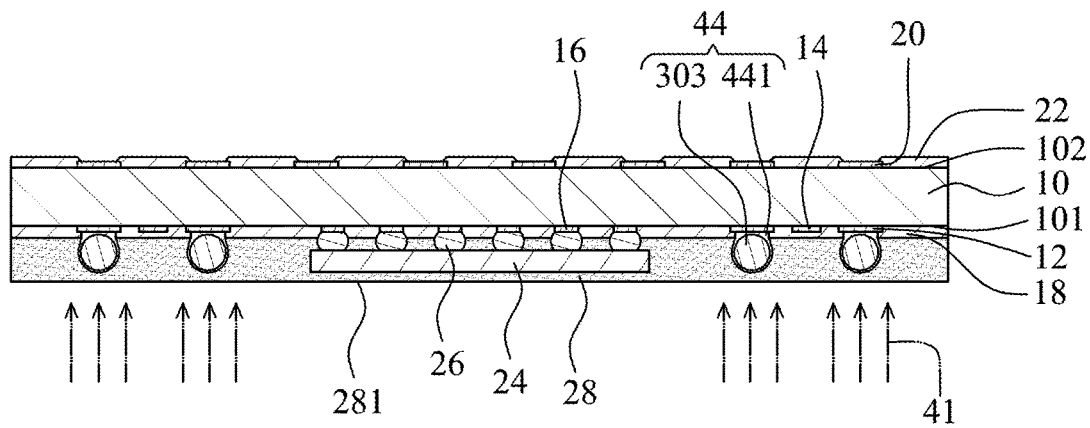
Figure 18:
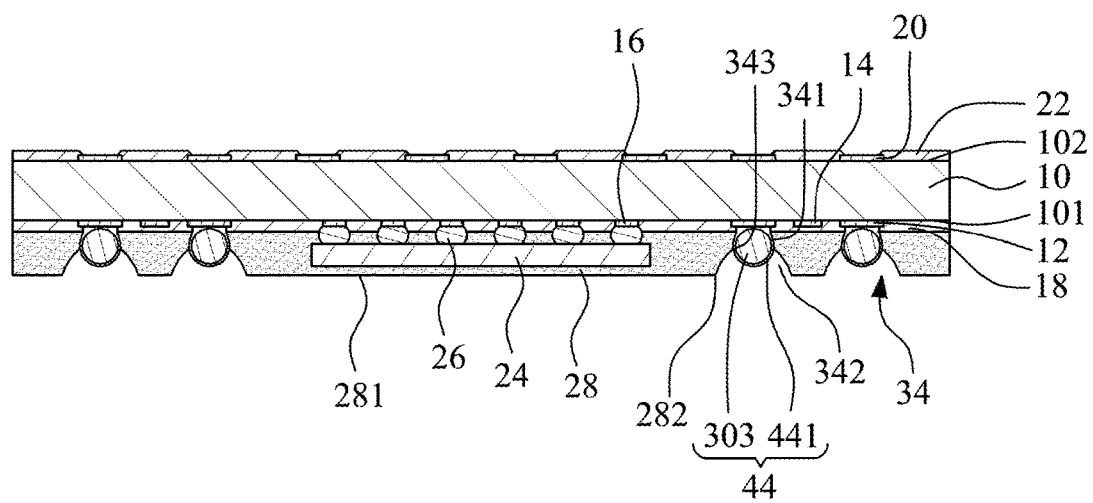

Referring to FIG. 17, a package body 28 is formed adjacent to the first surface 101 of the substrate 10 to encapsulate/cover the semiconductor die 24 and the solder balls 44. The package body 28 has a bottom surface 281. Then, a portion of the package body 28 corresponding to the solder balls 44 is removed along one or more machining paths 41 so as to expose the solder balls 44, as shown in FIG. 18. In one or more embodiments, the machining paths 41 are paths followed by one or more laser beams and the laser beams are applied on areas below the solder balls 44 (in the orientation shown in FIG. 17.

Referring to FIG. 18, the removal of the portion of the package body 28 bottom surface 281 forms one or more openings which correspond to a second portion 342 of a cavity 34.

Figure 19:
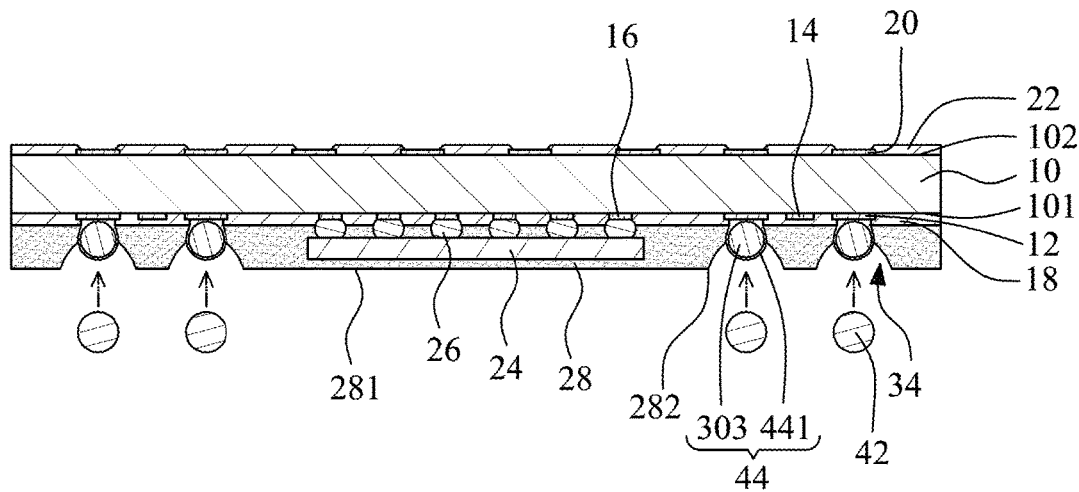

Referring to FIG. 19, second solder balls 42 are provided to fuse with corresponding solder balls 44 to form a connecting element 30a, so as to form the semiconductor device 3 illustrated in FIG. 4. In this embodiment, the material of the solder ball 42 is the same as, or similar to, the material of the periphery portion 441 of the solder ball 44. During the fusing process, the second solder ball 42 and the lower portion (exposed portion) of the periphery portion 441 of the solder ball 44 are molten and fused together, whereas the core portion 303 of the solder ball 44 remains solid. Therefore, a height of the connecting element 30a of FIG. 4 is greater than the height of the connecting element 30 of FIG. 2, which does not have a core portion 303.

Figure 20:
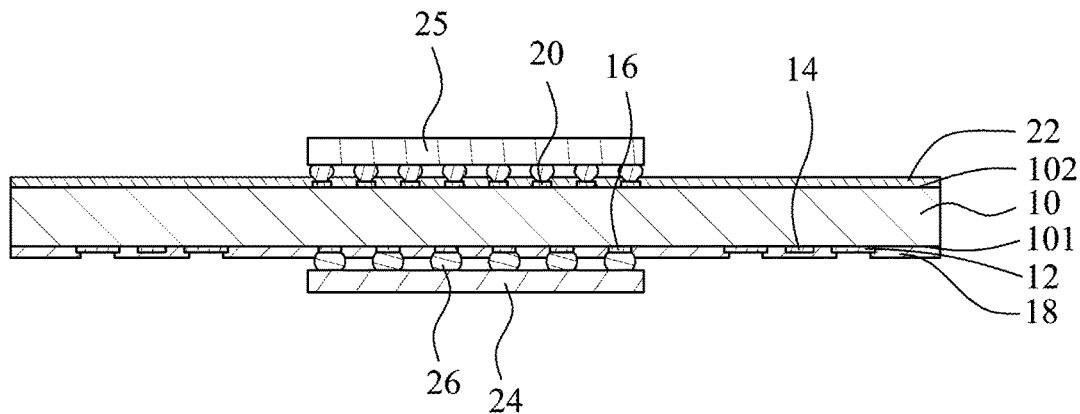
FIG. 20 and FIG. 21 illustrate a method for manufacturing a semiconductor device according to an embodiment of the present disclosure.
Figure 21:
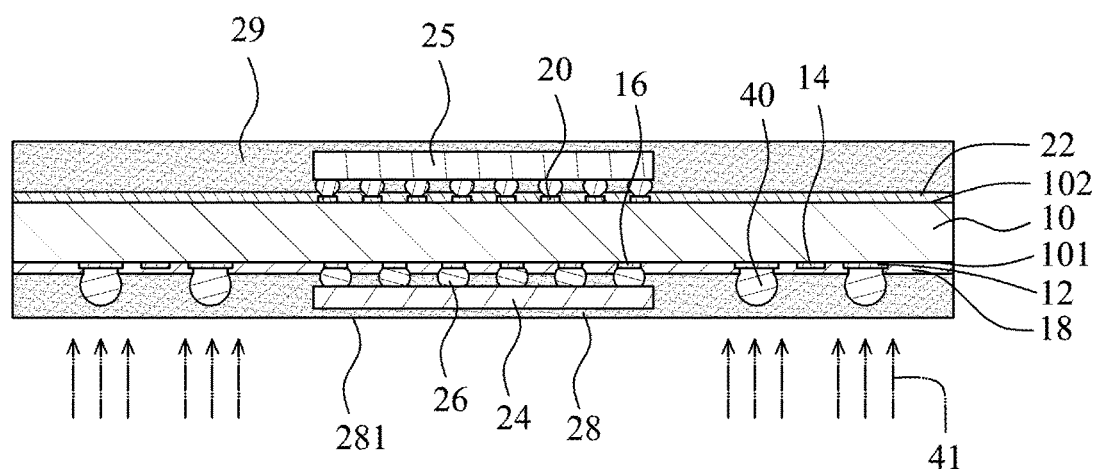

FIGS. 20 and 21 illustrate a method for manufacturing a semiconductor device according to an embodiment of the present disclosure. The method of this embodiment is similar to the method of FIGS. 9 to 14, and the difference is the initial stage. FIG. 20 is similar to FIG. 9, except that a second semiconductor die 25 is further provided, and the semiconductor die 25 is electrically connected to the top pads 20 on the second surface 102 of the substrate 10. Then, one or more solder balls 40 is formed adjacent to the first surface 101 of the substrate 10 (similarly as described with respect to FIG. 10).

FIG. 21 is similar to FIG. 11, except that a second package body 29 is further formed adjacent to the second surface 102 of the substrate 10 to encapsulate/cover the second semiconductor die 25. In this embodiment, a material of the package body 29 is the same as, or similar to, a material of the package body 28, and they are formed at the same time.

Subsequent stages are similar to those described with respect to FIGS. 11 to 14, and result in forming the semiconductor device 4 illustrated in FIG. 5.

As used herein, the terms "substantially" and "about" are used to describe and account for small variations. For example, when used in conjunction with a numerical value, the terms can encompass a range of variation of less than or equal to ±10% of that value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For another example, two values which are "substantially equal" can encompass a difference between the two values that is less than or equal to ±10% of one of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

The term "substantially flat" can refer to a surface roughness (Ra) of no greater than about 20 micrometers, no greater than about 15 micrometers, or no greater than about 10 micrometers, such as about 3 µm to about 20 µm, or where a difference between a highest point and a lowest point of the surface is no greater than about 20 micrometers, no greater than about 15 micrometers, or no greater than about 10 micrometers, such as about 5 µm to about 10 µm. The term "substantially parallel" with respect to two edges or surfaces can refer to lying along a line or along a plane, with a displacement from the line or plane being no greater than about 20 micrometers, no greater than about 15 micrometers, or no greater than about 10 micrometers, such as about 3 µm to about 20 µm. The term "substantially uniform" in the context of thickness values can refer to a variation in thickness of no greater than about 20 micrometers, no greater than about 15 micrometers, or no greater than about 10 micrometers, such as about 5 µm to about 10 µm.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor device, comprising:
a substrate having a first surface and a second surface opposite to the first surface;
a sensor plate attached and electrically connected to the second surface of the substrate, wherein the sensor plate is a glass plate;
a first package body disposed adjacent to the first surface of the substrate, the first package body defining at least one cavity; and
at least one connecting element disposed adjacent to the first surface of the substrate and in a corresponding cavity, wherein a space is defined between a periphery surface of a portion of the connecting element and a sidewall of a portion of the cavity, and an end portion of the connecting element extends beyond an outermost surface of the first package body.

2. The semiconductor device according to claim 1, further comprising a first semiconductor die electrically connected to the first surface of the substrate, wherein the first package body encapsulates the first semiconductor die, and the at least one connecting element includes a plurality of connecting elements positioned around the first semiconductor die.

3. The semiconductor device according to claim 1, further comprising at least one pad on the substrate, wherein the cavity includes a first portion and a second portion, the connecting element includes a first portion and a second portion, the first portion of the connecting element fills the first portion of the cavity and contacts the pad, the second portion of the connecting element is in the second portion of the cavity, the space is between a periphery surface of the second portion of the connecting element and a sidewall of the second portion of the cavity, and the end portion is an end of the second portion of the connecting element.

4. The semiconductor device according to claim 3, wherein a curvature of a sidewall of the first portion of the cavity and a curvature of the sidewall of the second portion of the cavity are discontinuous, a maximum lateral width of the second portion of the cavity is greater than a maximum lateral width of the first portion of the cavity, a curvature of the periphery surface of the first portion of the connecting element and a curvature of a periphery surface of the second portion of the connecting element are discontinuous, and a maximum lateral width of the second portion of the connecting element is greater than a maximum lateral width of the first portion of the connecting element.

5. The semiconductor device according to claim 3, wherein a maximum lateral width of the first portion of the connecting element is $W_1$, a maximum lateral width of the second portion of the connecting element is $W_2$, $W_2=a*W_1$, and a is about 0.8 to about 1.6.

6. The semiconductor device according to claim 3, wherein a depth of the first portion of the cavity is $D_1$, a depth of the second portion of the cavity is $D_2$, $D_2=c*D_1$, and c is about 0.9 to about 20.

7. The semiconductor device according to claim 1, wherein the connecting element includes a core portion and a periphery portion covering the core portion, and a material of the core portion is different form a material of the periphery portion.

8. The semiconductor device according to claim 1, further comprising a device electrically connected to the connecting element and spaced apart from the substrate.

9. The semiconductor device according to claim 3, wherein a height of the second portion of the connecting element that protrudes from the outermost surface of the first package body is $H_2$, a height of a remaining portion of the connecting element is $H_1$, $H_1=b*H_2$, and b is about 1.6 to about 5.8.

10. A semiconductor device, comprising:
a substrate having a first surface and a second surface opposite to the first surface, the substrate comprising at least one ball pad;
a package body disposed adjacent to the first surface of the substrate, the package body defining at least one cavity, wherein the cavity includes a first portion and a second portion;
a device spaced apart from the substrate;
at least one connecting element connecting the substrate and the device, wherein each connecting element includes a first portion and a second portion, the first portion of the connecting element fills the first portion of the cavity and contacts a respective ball pad, the second portion of the connecting element is in the second portion of the cavity, a space is defined between a periphery surface of the second portion of the connecting element and a sidewall of the second portion of the cavity, and the second portion connects to the device; and
a sensor plate attached and electrically connected to the second surface of the substrate, wherein the sensor plate is a glass plate.

11. The semiconductor device according to claim 10, wherein a curvature of a sidewall of the first portion of the cavity and a curvature of a sidewall of the second portion of the cavity are discontinuous, a maximum lateral width of the second portion of the cavity is greater than a maximum lateral width of the first portion of the cavity, a curvature of the periphery surface of the first portion of the connecting element and a curvature of a periphery surface of the second portion of the connecting element are discontinuous, and a maximum lateral width of the second portion of the connecting element is greater than a maximum lateral width of the first portion of the connecting element.

12. The semiconductor device according to claim 10, further comprising a first semiconductor die electrically connected to the first surface of the substrate and encapsulated by the package body.

13. The semiconductor device of claim 10, wherein the sensor plate comprises an electrical circuit configured to generate an electrical potential difference in response to an object touching the sensor plate.

14. A semiconductor device, comprising:
a substrate having a first surface and a second surface opposite to the first surface, and including at least one pad disposed thereon;

a sensor plate attached and electrically connected to the second surface of the substrate, wherein the sensor plate is a glass plate;

a first package body disposed adjacent to the first surface of the substrate, the first package body defining at least one cavity, wherein the cavity includes a first portion and a second portion; and at least one connecting element disposed adjacent to the first surface of the substrate and in a corresponding cavity, wherein a space is defined between a periphery surface of a portion of the connecting element and a sidewall of a portion of the cavity, the connecting element includes a core portion and a periphery portion covering the core portion, a material of the core portion has a melting temperature that is higher than a melting temperature of a material of the periphery portion, the connecting element includes a first portion and a second portion, the first portion of the connecting element fills the first portion of the cavity and contacts the pad, the second portion of the connecting element is in the second portion of the cavity, the space is between a periphery surface of the second portion of the connecting element and a sidewall of the second portion of the cavity, a curvature of a sidewall of the first portion of the cavity and a curvature of the sidewall of the second portion of the cavity are discontinuous, a maximum lateral width of the second portion of the cavity is greater than a maximum lateral width of the first portion of the cavity, a curvature of a periphery surface of the first portion of the connecting element and a curvature of the periphery surface of the second portion of the connecting element are discontinuous, a maximum lateral width of the second portion of the connecting element is greater than a maximum lateral width of the first portion of the connecting element, and an end portion of the connecting element extends beyond an outermost surface of the first package body.

15. The semiconductor device according to claim 14, wherein the core portion of the connecting element protrudes from the first portion of the cavity and does not protrude from the second portion of the cavity.

16. The semiconductor device according to claim 14, wherein the material of the core portion is different from the material of the periphery portion.

17. The semiconductor device according to claim 14, wherein the lateral width of the first portion of the connecting element is less than or equal to about $W_1$, the lateral width of the second portion of the connecting element is less than or equal to about $W_2$, $W_2 = a*W_1$, and "a" is a multiplier of about 0.8 to about 1.6.

* * * * *